(12) United States Patent
Zbrzezny et al.

(10) Patent No.: US 7,888,259 B2
(45) Date of Patent: Feb. 15, 2011

(54) INTEGRATED CIRCUIT PACKAGE EMPLOYING PREDETERMINED THREE-DIMENSIONAL SOLDER PAD SURFACE AND METHOD FOR MAKING SAME

(75) Inventors: Adam R. Zbrzezny, Scarborough (CA); Roden R. Topacio, Markham (CA)

(73) Assignee: ATI Technologies ULC, Markham, Ontario (CA)

( * ) Notice: Subject to any disclaimer, the term of this patent is extended or adjusted under 35 U.S.C. 154(b) by 191 days.

(21) Appl. No.: 12/194,265

(22) Filed: Aug. 19, 2008

(65) Prior Publication Data

US 2010/0044884 A1  Feb. 25, 2010

(51) Int. Cl.
*H01L 21/00* (2006.01)
(52) U.S. Cl. .................. 438/612; 438/614; 438/617; 257/E21.514; 257/E23.004; 257/E23.021; 257/E23.067; 257/E31.108
(58) Field of Classification Search .................. 257/698, 257/735–738, 777–783, E21.514, 23.004, 257/12, 21, 67, 183, 31.108; 438/612–617
See application file for complete search history.

(56) References Cited

U.S. PATENT DOCUMENTS

| 4,122,479 | A | * | 10/1978 | Sugawara et al. | ............. 257/82 |
| 4,332,343 | A | | 6/1982 | Koopman et al. | |
| 5,018,002 | A | * | 5/1991 | Neugebauer et al. | ........ 257/698 |
| 5,162,257 | A | | 11/1992 | Yung | |
| 5,308,928 | A | * | 5/1994 | Parla et al. | ................. 174/261 |
| 6,094,832 | A | * | 8/2000 | Regner et al. | ................. 33/562 |
| 6,492,738 | B2 | * | 12/2002 | Akram et al. | ............... 257/783 |
| 6,509,647 | B2 | * | 1/2003 | Akram et al. | ............... 257/738 |
| 6,696,757 | B2 | * | 2/2004 | Yunus et al. | ................. 257/735 |
| 6,894,400 | B1 | * | 5/2005 | Goodelle et al. | ............ 257/795 |
| 7,012,018 | B2 | * | 3/2006 | Tellkamp | .................... 438/614 |
| 7,397,129 | B2 | | 7/2008 | Lee | |
| 7,504,728 | B2 | * | 3/2009 | Ryan | .......................... 257/764 |
| 2008/0029888 | A1 | | 2/2008 | Park et al. | |
| 2008/0258297 | A1 | | 10/2008 | Yip et al. | |

FOREIGN PATENT DOCUMENTS

DE  10347622 A1  5/2005

OTHER PUBLICATIONS

International Search Report; from Canadian Patent Office; International Application No. PCT/CA2009/001086; dated Nov. 19, 2009.

* cited by examiner

*Primary Examiner*—Michael S Lebentritt
(74) *Attorney, Agent, or Firm*—Vedder Price P.C.

(57) ABSTRACT

An integrated circuit package employs a solder pad that includes a predetermined three dimensional surface that is adapted to receive solder. In one example, the predetermined three dimensional surface includes at least one predetermined hill or protruding portion and a valley portion, such as a lower portion, having a predetermined relative height between the hill portion and a valley portion. The predetermined three dimensional surface can be configured in any suitable configuration and may include contoured patterns, non-patterns, or any other suitable configuration as desired. A related method is also described.

8 Claims, 5 Drawing Sheets

US 7,888,259 B2

INTEGRATED CIRCUIT PACKAGE EMPLOYING PREDETERMINED THREE-DIMENSIONAL SOLDER PAD SURFACE AND METHOD FOR MAKING SAME

BACKGROUND OF THE INVENTION

The invention relates generally to integrated circuit package solder pad designs.

Reliability of handheld devices and other devices relating to drop performance or shock performance is increasingly important. For example, when a cell phone or other handheld device is accidentally dropped by a user, integrated circuits including integrated circuit packages within the cell phone can be subjected to high stresses for short durations. In some cases, the stress is sufficiently high to cause solder joints of packages or integrated circuit components to break from their substrates. A common failure mode is a cracking through an intermetallic (IMC) layer on a solder pad at a substrate surface through, for example, a ball grid array type solder joint based connection. As is known, the intermetallic layer is produced during a solder reflow process. The IMC can be brittle.

Common designs of solder pads have been flat with no features. As such, it is easy for a crack to propagate along the (IMC) layer between the solder ball and solder pad surface. Such cracks may only require a relatively small energy to propagate through the solder joint.

Proposed solutions that attempt to reduce the solder joint cracking problem, include using different solder alloys for flat solder pads. For example, the reduction of nickel has been employed on flat surfaces when using a tin based solder alloy. However, undesirable cracking of the solder joint is still apparent with such solutions.

As such, there is a need for an improved integrated circuit solder joint technology.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Briefly, an integrated circuit package employs a solder pad that includes a predetermined (e.g., a non-randomly occurring or non-naturally occurring three dimensional surface that falls outside naturally occurring imperfections when forming a solder pad) three dimensional surface that is adapted to receive solder. In one example, the predetermined three dimensional surface includes at least one predetermined hill or protruding portion and a valley portion, such as a lower portion, having a predetermined relative height between the hill portion and a valley portion. The predetermined three dimensional surface can be configured in any suitable configuration and may include contoured patterns, non-patterns, or any other suitable configuration as desired.

In one example, the predetermined relative height between a hill portion and a valley portion of the predetermined three dimensional surface of the solder pad is at least 5 microns. However, any suitable predetermined relative height may be employed. A method of making the predetermined three dimensional surface is also disclosed and includes, for example, forming on a substrate, at least one solder pad that includes the predetermined three dimensional surface that is adapted to receive solder. In addition, the method includes forming a solder mask layer to expose at least the solder pad that includes the predetermined three dimensional surface. The forming of the predetermined three dimensional surface may be performed in any suitable manner including, but not limited to, an additive process that adds metal or a subtractive process that removes metal from certain locations to form the predetermined three dimensional surface.

Among other advantages, the three dimensional solder pad configuration may provide crack propagation retardation. The predetermined three dimensional surface configuration can cause a crack to propagate through the bulk solder. By diverting the crack path away from the intermetallic layer through the bulk solder, a stronger and more reliable solder interconnect can be achieved. As such, a higher stress needs to be applied than that applied in the case of, for example, a flat surface solder pad. Other advantages will be recognized by those of ordinary skill in the art.

Figure 1:
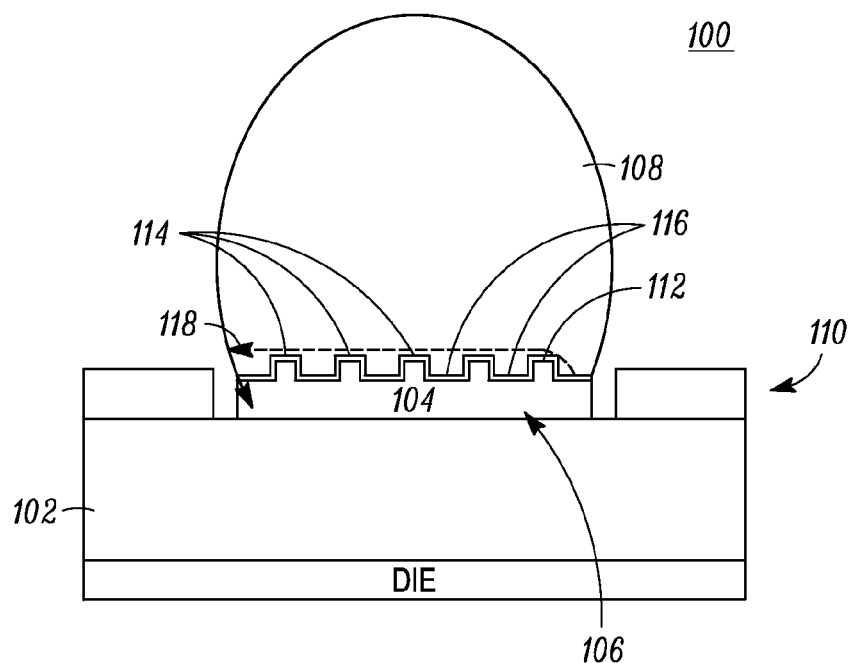
FIG. 1 is a cross section illustrating one example of a portion of an integrated circuit that employs a predetermined three dimensional solder pad surface in accordance with one example disclosed herein.

FIG. 1 illustrates one example of a portion of an integrated circuit package 100 that employs one or more solder pads that include a predetermined three dimensional surface that is adapted to receive solder. In this example, a substrate 102, such as an integrated circuit package substrate supports a solder pad 104 that includes a predetermined three dimensional surface 106 that is adapted to receive solder 108. In this example, the integrated circuit 100 may be an integrated circuit that employs a ball grid array (BGA) structure, however any suitable integrated circuit design and/or package structure may be employed. As shown, the solder 108 is shown to be a solder ball but may be any suitable shape as desired. In addition, in this example, the integrated circuit includes a solder mask layer 110. An intermetallic layer 112 is formed between the solder pad 104 and the solder 108. As shown in this example, the predetermined hill and valley configuration of the solder pad includes a plurality of substantially equally spaced protruding hills.

In this example, the solder pad 104 with a predetermined three dimensional surface 106 includes copper pads that are finished with solderability protective layers such as OSP, immersion Ag, immersion Sn, ENIG (electroless nickel immersion gold), ENEPIG (electroless nickel electroless palladium immersion gold), or any other suitable layer if desired. As a result of soldering, such as through a soldering reflow process, the intermetallic layer 112 is formed between the solder ball 108 and the outer most metal of the pad 104. The integrated circuit 100 shown in this example is an integrated circuit die. However, the integrated circuit may also include a package. A printed circuit board such as a mother board (not shown) is soldered together via the solder reflow process to the integrated circuit.

The solder pad 104 with the predetermined three dimensional surface 106 is shown such that the three dimensional surface 106 includes a predetermined hill configuration or protruding portions 114 and one or more valley portions 116. By way of illustration, the dashed line 118 illustrates a crack propagation direction and location in the event of a stress. As shown, resistance is provided by the predetermined three dimensional surface to resist cracking since the stress is directed more towards the ball gate array solder and solder resists crack propagation much better than IMC does In addition, the predetermined three dimensional surface can provide an improved adhesion of the IMC layer 112. For example, the protruding three dimensional features block the crack propagation through the IMC layer and force the crack to propagate through the solder. By diverting the crack from the intermetallic layer, a more reliable solder interconnection may be realized. Other advantages will be recognized by those of ordinary skill in the art.

Figure 2:
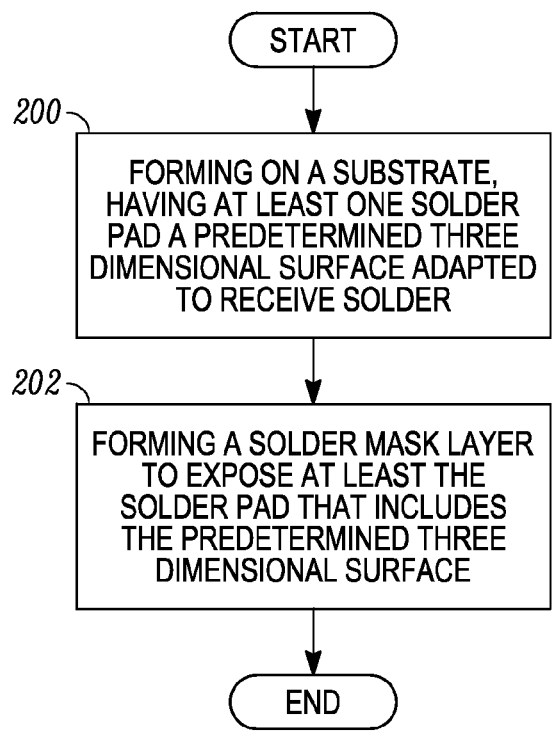
FIG. 2 is a flowchart illustrating one example of a method for making an integrated circuit employing a predetermined three dimensional solder pad surface in accordance with one example disclosed herein.

Referring to FIG. 2, a method for making an integrated circuit with the solder pad of FIG. 1 includes, as shown in block 200, forming on the substrate 102, the solder pad 104 that includes the predetermined three dimensional surface 106. In addition, as shown in block 202, a solder mask layer 110 may be formed in a manner to expose at least the solder pad 104 that includes the predetermined three dimensional surface 106. Exposing the solder pad allows for the solder 108 to be reflowed onto the three dimensional solder pad 104.

Although a patterned three dimensional configuration is shown in FIG. 1, as noted above, any suitable configuration whether patterned or not may be employed. The three dimensional solder pad design may be employed on multiple solder pads on an integrated circuit package as desired.

Figure 3:
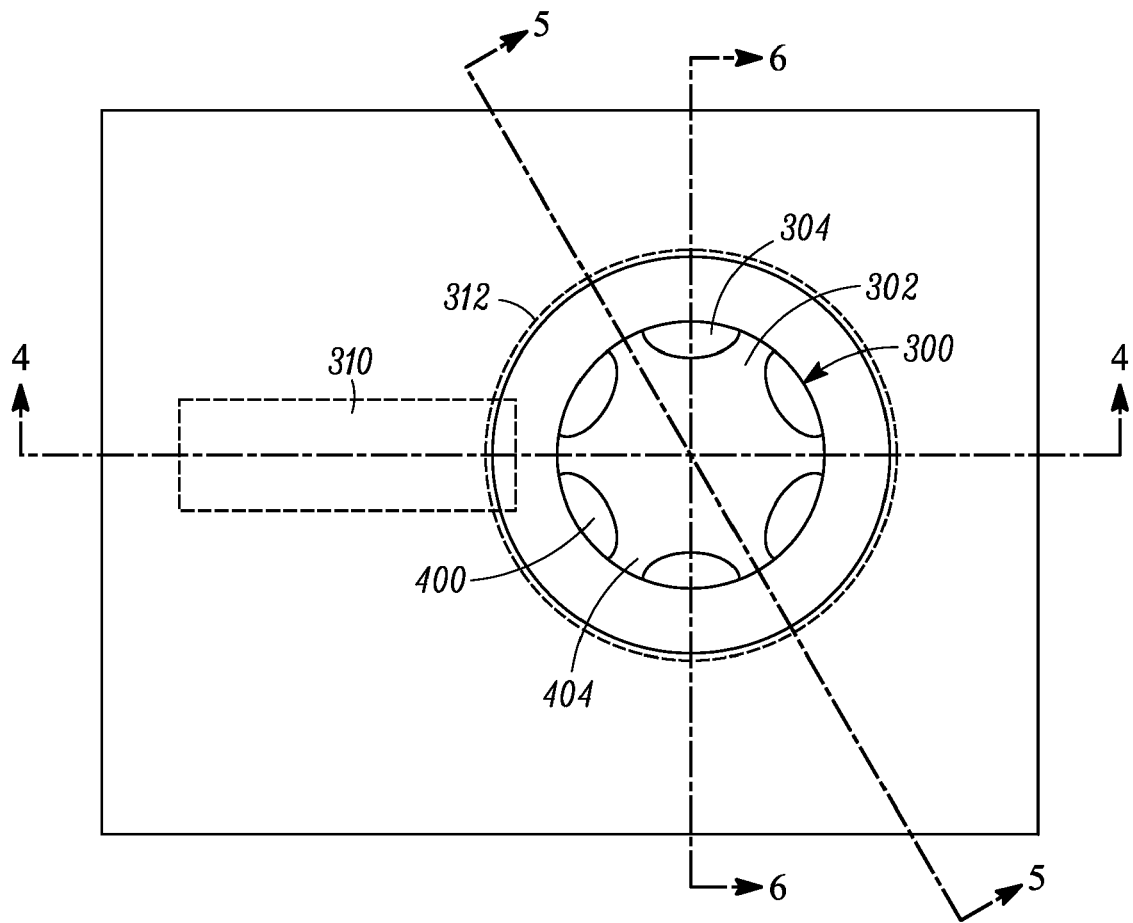
FIG. 3 is a top view of a solder pad on an integrated circuit in accordance with one example disclosed herein.

FIG. 3 is a top view of a portion of an integrated circuit and shows employing a different design of a predetermined three dimensional surface 300. In this example, a predetermined single hill 302 and a valley configuration 304 is shown. As noted above, however, any suitable hill and valley configuration may be employed.

Figure 4:
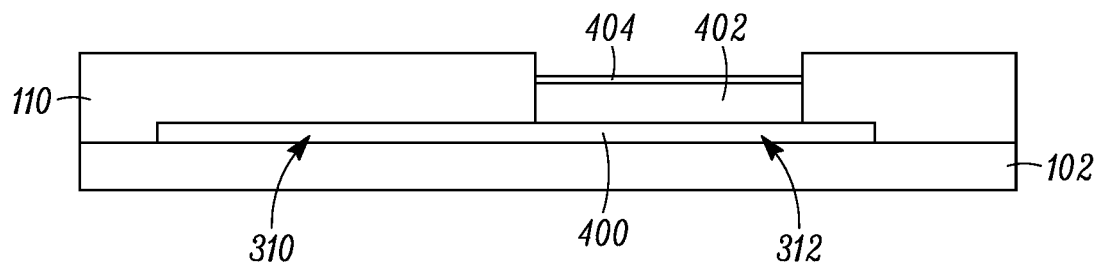
FIG. 4 is a cross sectional view of the solder pad of FIG. 3.

A metal layer 400 is placed on the substrate 102 using known plating techniques. In this example, the metal layer 400 is made of a copper alloy and forms a trace portion 310 and a solder pad portion 312. Another metal layer 402, as shown in FIG. 4, in this example a layer is placed on the metal layer 400 to form another layer of the solder pad. In this example, the layer 402 is a nickel (Ni) layer. Another metal layer 404 is placed on the nickel layer 402 and in this example is an Au layer. Although not shown, the copper layer portions that form the solder pad may be OSP coated as known in the art. In this example, the hill portion 302 is formed using the nickel and Au layers. The valley portion is made up of the copper layer 400. However, it will be recognized that a single layer of metal may be used or multiple layers if desired.

Figure 5:
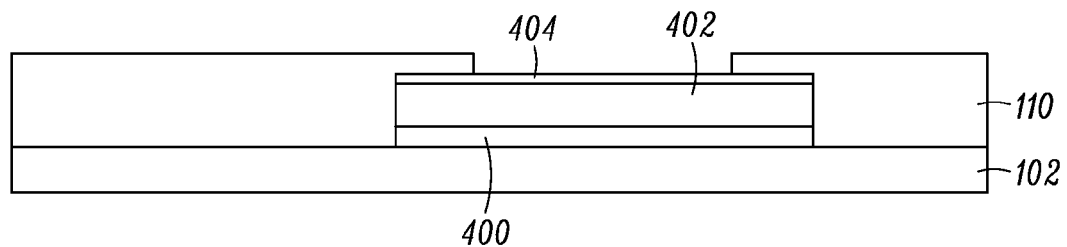
FIG. 5 is another cross sectional view of the solder pad shown in FIG. 3.

FIG. 5 illustrates another perspective of a cross section view of the pad shown in FIG. 3. As shown in this example, the solder mask layer 110 covers a portion of the solder pad 300 that includes the predetermined three dimensional surface 106.

Figure 6:
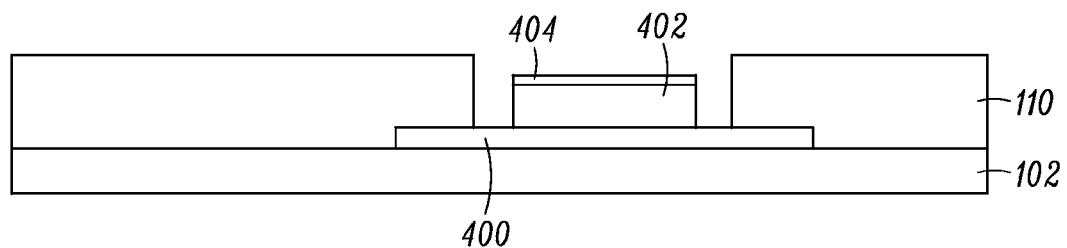
FIG. 6 is a cross section of the solder pad of FIG. 3.

FIG. 6 is another cross sectional view taken from another perspective from FIG. 3. The integrated circuit package can be a component of any suitable device such as a handheld device including, but not limited to, a cell phone, personal digital assistant, or other suitable handheld device and may also be in any other suitable device whether handheld or non-handheld including cameras, laptops, desktop computers or in any other suitable device as desired.

Figure 7:
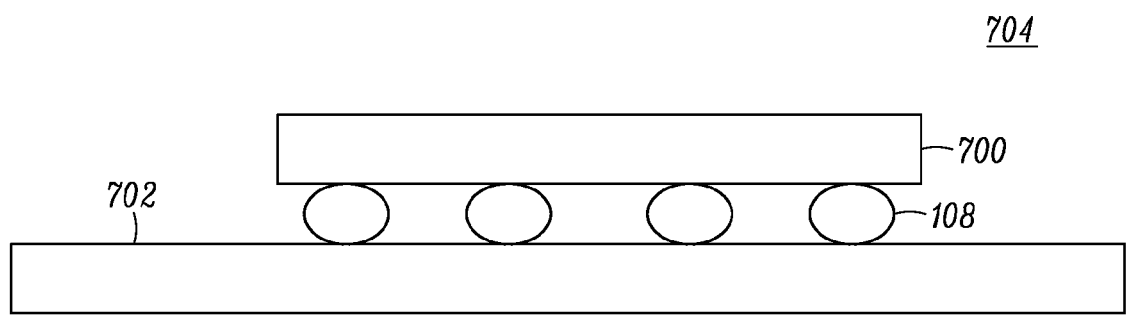
FIG. 7 is a cross section of an integrated circuit soldered to a substrate in accordance with one example disclosed herein.

FIG. 7 illustrates one example of an integrated circuit package 700 that employs the solder pads having predetermined three dimensional surfaces of the type described above soldered to another substrate 702 such as a printed circuit board, ceramic substrate, another integrated circuit die package, or any other suitable substrate. The integrated circuit assembly shown in FIG. 7 is shown to include solder joints formed by solder balls 108 as part of a ball grid array configuration for integrated circuit 700, soldered to the substrate 702 that has corresponding metal pads that may or may not include solder pads having predetermined three dimensional surfaces. The circuit assembly 704 as shown includes the integrated circuit 700 that in this example includes a package that encloses a substrate as shown, (for example substrate 110) and the solder pad of the type shown above. It also includes the substrate 702 that is coupled to the solder pad that includes the predetermined three dimensional surfaces, through one or more solder joints.

Figure 8:
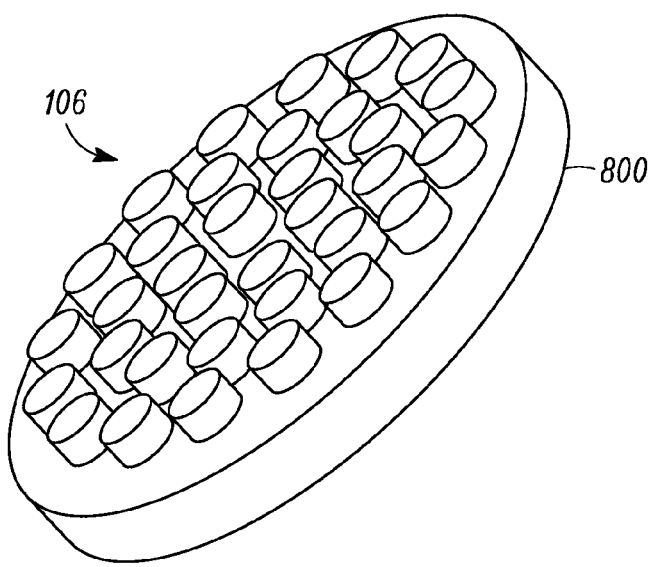
FIG. 8 is a perspective view of one example of a three dimensional solder pad in accordance with one example disclosed herein.

FIG. 8 illustrates one example of a solder pad 800 that includes a predetermined three dimensional surface adapted to receive solder generally shown as surface 106 and in this embodiment, shows the hills protruding from the valley configuration.

Figure 9:
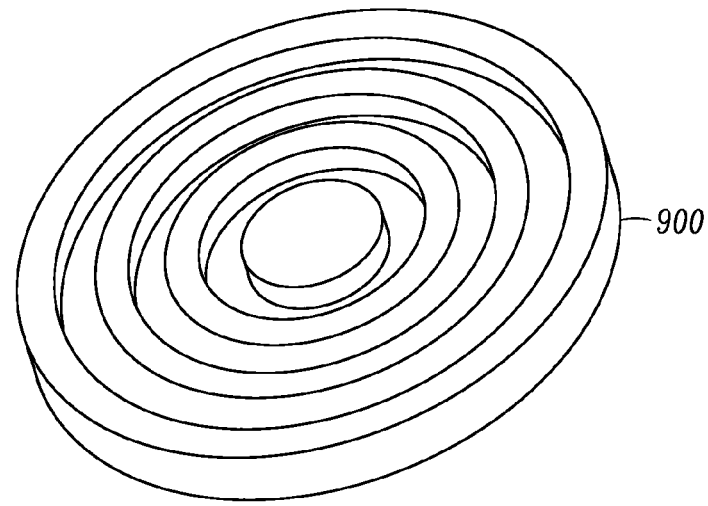
FIG. 9 is a perspective view of one example of a three dimensional solder pad in accordance with one example disclosed herein.

FIG. 9 illustrates another solder pad configuration 900 wherein a plurality of hills, three of them being shown as rings and a center protruding circle being another hill with valley portions interposed between the hills. As such, the hill and valley configuration of the solder pad may include a curved hill arrangement or any other desired configuration.

Figure 10:
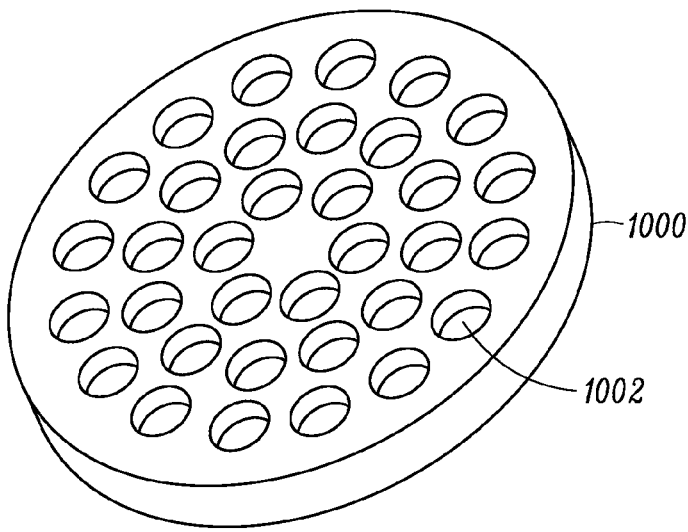
FIG. 10 is a perspective view of one example of a three dimensional solder pad in accordance with one example disclosed herein.

FIG. 10 illustrates yet another example of a solder pad 1000 including predetermined three dimensional surface adapted to receive solder wherein the valley configuration includes a plurality of circular indented portions shown as 1002. The hill configuration defines the valley configuration. Any suitable configuration may be employed such a spiral hill or spiral valley configuration or any other suitable configuration.

Figure 11:
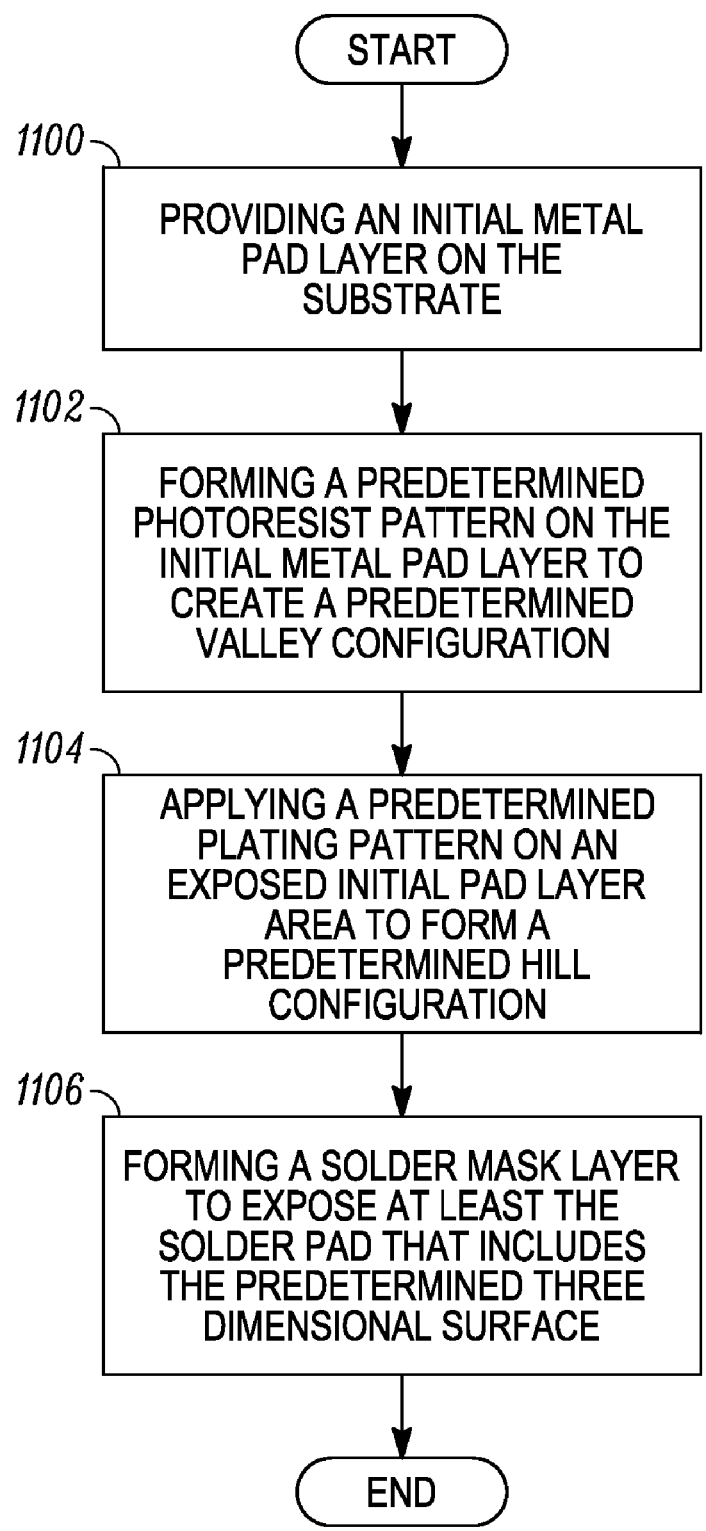
FIG. 11 is a flowchart illustrating one example of a method for making an integrated circuit in accordance with one example disclosed herein.

FIG. 11 illustrates one example of a method of making an integrated circuit package. The pad metal can be copper, nickel, a combination of both materials or any other suitable material as desired. A process to build the three dimensional solder pad structure may also include mixing the pad finish such as nickel/Au and Cu/organic solder preservatives. In this example, the Ni/Au will create the contour pattern above the copper/OSP plating. The process for making the three dimensional pad includes normal substrate processing techniques to form the base copper pad layer 400. This for example, is shown in block 1100 as providing an initial metal pad layer on the substrate. As shown in block 1102, the method includes forming a predetermined photoresist pattern on the initial metal pad layer 400 to create a predetermined three dimensional configuration. This includes, in one example, using a photoresist pattern to create a predetermined valley configuration. As shown in block 1104, the method includes applying a predetermined plating pattern on an exposed initial pad layer area to form the predetermined hill configuration. This plating is placed on the exposed pad areas that do not have the photoresist pattern. The method may then include removing the photoresist and then as shown in block 1106, forming a solder mask layer to expose the solder pad that includes the predetermined three dimensional surface. Another step may include plating the three dimensional pad with organic solder preservative (OSP).

Referring also to FIG. 3, the photoresist pattern is a predetermined pattern of photoresist to create an exposed shape of a star like figure. The photoresist covers the valley area. An Ni/Au plating process is then used on the exposed star area to plate the star area with the Ni/Au layer. The photoresist on the valley area is then removed and the solder mask is then placed over any desired area. In this example, the pointy portions of the star are covered by a circular solder mask. Thereafter, the OSP is applied to the remaining metal area of the three dimensional solder pad.

A similar operation is carried out for a subtractive process except that the metal layers of nickel and Au are placed and then photoresist is placed in the shape of a hill and the valleys are then removed or subtracted through photo processes.

The method of making integrated circuit may also include placing solder on the three dimensional solder pad that includes the predetermined three dimensional surface and reflowing the solder, for example, to another surface such as another substrate as shown in FIG. 7, to form an intermetallic layer over the predetermined three dimensional surface.

Among other advantages, the three dimensional solder pad configuration may provide crack propagation retardation. The predetermined three dimensional surface configuration can cause a crack to propagate through the bulk solder. By diverting the crack path away from the intermetallic layer through the bulk solder, a stronger and more reliable solder interconnect can be achieved. As such, a higher stress needs to be applied than that applied in the case of, for example, a flat surface solder pad. Other advantages will be recognized by those of ordinary skill in the art. Also, the term "package" may include a die so that if desired, the solder pad configuration may be applied to a die.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. A method of making an integrated circuit package comprising:
   forming on a substrate, at least one solder pad comprising a predetermined three dimensional surface adapted to receive solder;
   forming a solder mask layer to expose at least the solder pad comprising the predetermined three dimensional surface;
   wherein forming on the substrate, at least one solder pad comprising the predetermined three dimensional surface adapted to receive solder comprises forming at least one predetermined hill and valley configuration having a predetermined relative height between an hill portion and a valley portion; and
   wherein forming at least one predetermined hill and valley configuration having a predetermined relative height between an hill portion and a valley portion is comprised of forming the hill portion using a metal adding process.

2. The method of claim 1 comprising:
   placing solder on the solder pad comprising the predetermined three dimensional surface; and
   reflowing the solder to form an intermetallic layer over the predetermined three dimensional surface.

3. The method of claim 1 wherein forming at least one predetermined hill and valley configuration having a predetermined relative height between an hill portion and a valley portion is comprised of forming the valley portion using a metal removing process.

4. The method of claim 1 wherein forming on the substrate, the at least one solder pad comprising the predetermined three dimensional surface adapted to receive solder comprises:
   providing an initial metal pad layer on the substrate;
   forming a predetermined photoresist pattern on the initial metal pad layer to create a predetermined valley configuration; and
   applying a predetermined plating pattern on an exposed initial pad layer area to form a predetermined hill configuration.

5. The method of claim 4 further comprising:
   removing photoresist from a desired portion of the pad layer to expose a predetermined valley configuration; and
   applying an organic solder preservative over a desired portion of the predetermined valley configuration and the hill configuration.

6. The method of claim 1 wherein forming on the substrate, the at least one solder pad comprising the predetermined three dimensional surface adapted to receive solder comprises:
   plating a desired solder pad area;
   applying a predetermined pattern of photoresist layer that defines a hill portion; and
   removing metal from an area that does not have the predetermined photoresist pattern to form a defined valley portion.

7. A method of making an integrated circuit package comprising:
   forming on a substrate, at least one solder pad comprising a predetermined three dimensional surface adapted to receive solder;
   forming a solder mask layer to expose at least the solder pad comprising the predetermined three dimensional surface;
   wherein forming on the substrate, the at least one solder pad comprising the predetermined three dimensional surface adapted to receive solder comprises:
      plating a desired solder pad area;
      applying a predetermined pattern of photoresist layer that defines a hill portion;
      removing metal from an area that does not have the predetermined photoresist pattern to form a defined valley portion;
      removing photoresist from a desired portion of the pad layer to expose a predetermined valley configuration; and
      applying an organic solder preservative over a desired portion of the predetermined valley configuration and the hill configuration.

8. An integrated circuit made by a method comprising:
   forming on a substrate, at least one solder pad comprising a predetermined three dimensional surface adapted to receive solder;
   forming a solder mask layer to expose at least the solder pad comprising the predetermined three dimensional surface;

wherein forming on the substrate, at least one solder pad comprising the predetermined three dimensional surface adapted to receive solder comprises forming at least one predetermined hill and valley configuration having a predetermined relative height between an hill portion and a valley portion; and wherein forming at least one predetermined hill and valley configuration having a predetermined relative height between an hill portion and a valley portion is comprised of forming the hill portion using a metal adding process.

* * * * *